(12) United States Patent
Dutel

(10) Patent No.: US 8,692,989 B2
(45) Date of Patent: *Apr. 8, 2014

(54) METHOD FOR HYDROCARBON WELL COMPLETION

(71) Applicant: M-I, LLC, Houston, TX (US)

(72) Inventor: Lewis J. Dutel, Cypress, TX (US)

(73) Assignee: M-I LLC, Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/014,899

(22) Filed: Aug. 30, 2013

(65) Prior Publication Data

US 2014/0000965 A1  Jan. 2, 2014

Related U.S. Application Data

(63) Continuation of application No. 13/081,113, filed on Apr. 6, 2011, now Pat. No. 8,525,986.

(51) Int. Cl.
  *G01N 1/10*  (2006.01)
  *G01N 21/00* (2006.01)
  *E21B 47/00* (2012.01)

(52) U.S. Cl.
  USPC .................. 356/246; 356/338; 166/250.01

(58) Field of Classification Search
  None
  See application file for complete search history.

*Primary Examiner* — Gregory J Toatley
*Assistant Examiner* — Amanda Merlino
(74) *Attorney, Agent, or Firm* — Baker & Hostetler LLP

(57) ABSTRACT

A method of completing a hydrocarbon lateral well in a target shale formation. The method uses a data log generated from an optical flow cell assembly to identify areas in the lateral well of high free gas porosity. By evaluating such data, an operator can group "like" rock, determine stage length and variation in stage length, and determine perforation cluster spacing and location. The flow cell assembly can also be used in a completion program to assist in the steering of a lateral well being drilled below the target formation.

22 Claims, 15 Drawing Sheets

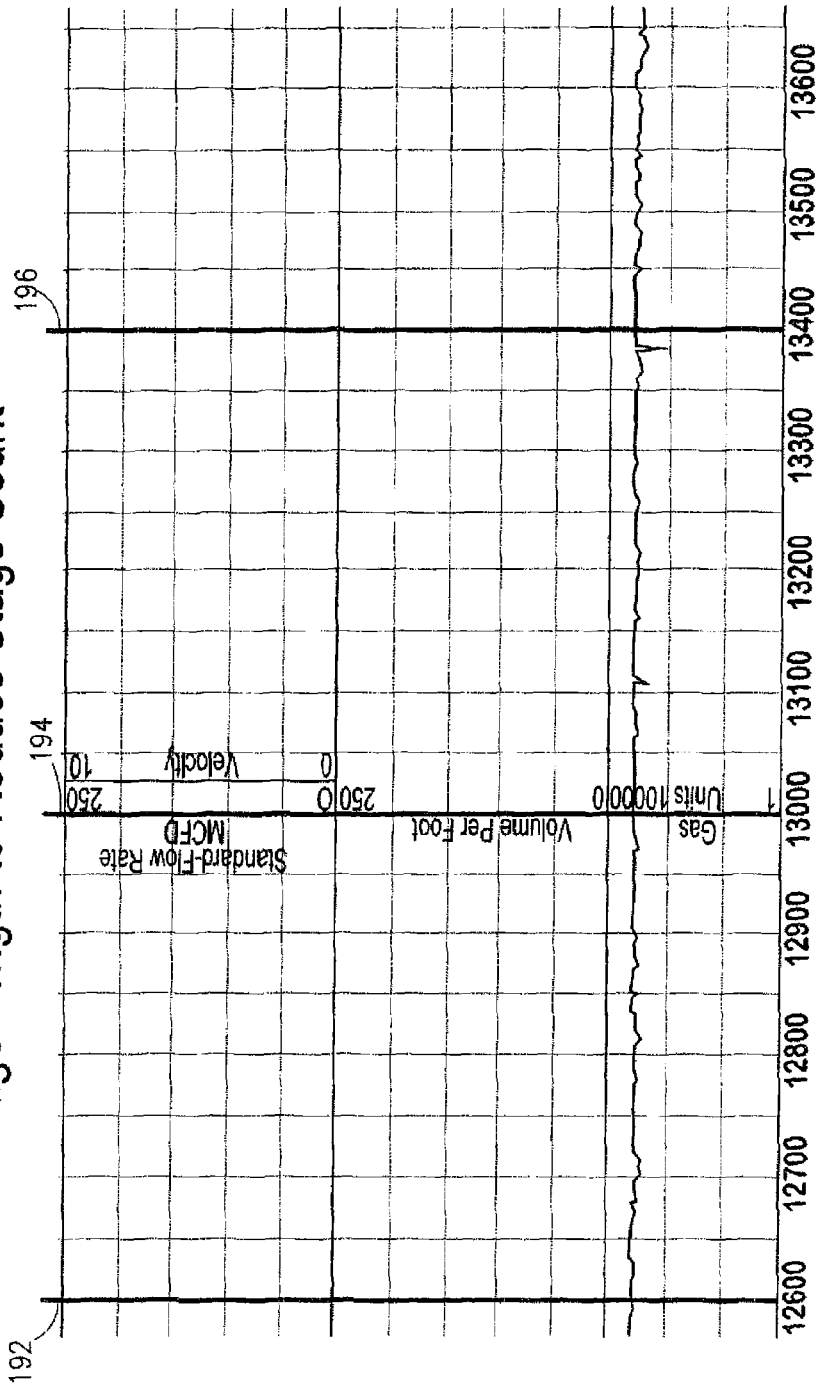

METHOD FOR HYDROCARBON WELL COMPLETION

CROSS REFERENCE TO RELATED APPLICATIONS

This application is a continuation of U.S. application Ser. No. 13/081,113, filed on Apr. 6, 2011 the contents of which are incorporated herein by reference.

BACKGROUND OF THE INVENTION

The present invention relates to a method of hydrocarbon well completion.

SUMMARY OF THE INVENTION

The present invention is a novel method of completing a lateral well in a target shale formation. The method includes the step of providing a flow cell assembly within a flare gas flow line of a rig drilling the lateral well. The gas flow line is in fluid communication with a return flow line of the lateral well. The assembly comprises a flow cell having an outer surface, an inner surface, and an internal bore. The flow cell includes a first aperture and a second aperture. Each of the first and second apertures provides an opening to the internal bore. An optical probe is detachably mounted on the outer surface of the flow cell. The optical probe has a proximal end and a distal end. The optical probe is disposed through the first aperture in the flow cell so that the distal end of the optical probe is positioned within the internal bore of the flow cell. The optical probe is capable of measuring the velocity of a gas flowing through the internal bore of the flow cell. An optical probe mounting assembly is detachably mounted on the outer surface of the flow cell. The optical probe mounting assembly encases a portion of the optical probe. A sensor means is detachably mounted on the outer surface of the flow cell. The sensor means includes a sensor array having a proximal end and a distal end. The sensor array is disposed through the second aperture in the flow cell so that the distal end of the sensor array is positioned within the internal bore of the flow cell. The sensor array includes a temperature sensor and a pressure sensor.

The method includes the step of obtaining a raw point flow velocity data of the gas flowing in said flow line.

The method includes the step of obtaining a temperature measurement of the gas in the flow line.

The method includes obtaining a pressure measurement of the gas in the flow line.

The method includes filtering the raw point flow velocity data to reject errant velocity data to obtain filtered raw point flow velocity data.

The method includes correcting the filtered raw point flow velocity data based on an empirical data of flow meter type and operating conditions to obtain a bulk velocity data.

The method includes calculating a corrected flow rate for the gas in the flow line based on the bulk velocity data and an internal diameter of the flow line.

The method includes using the temperature measurement and the pressure measurement for calculating the corrected flow rate for the gas in the flow line.

The method includes calculating a gas volume per foot drilled data based on the corrected flow rate for the gas and a time measurement.

The method includes using the corrected flow rate to determine an amount of gas in the return flow line.

The method includes generating a data log showing areas of the lateral well exhibiting high free gas porosity.

The method according to claim 1 wherein said data log is used to group the areas according to "like" rock characteristics.

The data log may be used to design a plurality of well completion stages. The data log may also be used to determine the length or variation in length of the plurality of well completion stages. The data log may also be used to concentrate the plurality of well completion stages in the areas of the lateral well exhibiting high free gas porosity. The data log may further show areas of low free gas porosity and therefore said to increase the length of the plurality of stages in the areas of low free gas porosity. The data log may also be used to determine spacing of a plurality of perforation clusters in each stage of the plurality of well completion stage.

The present invention is also directed to a novel method of drilling a lateral well in a target shale formation. The method includes providing a flow cell assembly as described hereinabove within a flare gas flow line of a rig drilling the lateral well. The gas flow line is in fluid communication with a return flow line of the lateral well.

The method includes the step of obtaining a raw point flow velocity data of the gas flowing in the flow line.

The method includes the step of obtaining a temperature measurement of the gas in the flow line.

The method includes the step of obtaining a pressure measurement of the gas in the flow line.

The method includes the step of filtering the raw point flow velocity data to reject errant velocity data to obtain filtered raw point flow velocity data.

The method includes the step of correcting the filtered raw point flow velocity data based on an empirical data of flow meter type and operating conditions to obtain a bulk velocity data.

The method includes the step of calculating a corrected flow rate for the gas in the flow line based on the bulk velocity data and an internal diameter of the flow line.

The method includes the step of using the temperature measurement and the pressure measurement for calculating the corrected flow rate for the gas in the flow line.

The method includes the step of calculating a gas volume per foot drilled data based on the corrected flow rate for the gas and a time measurement.

The method includes the step of using the corrected flow rate to determine an amount of gas in the return flow line.

The method includes the step of generating a first data log showing a first area of said lateral well exhibiting high free gas porosity.

The method includes using the data log showing the first area of the lateral well exhibiting high free gas porosity to adjust the direction of a drill bit assembly drilling the lateral well.

The method may further includes the steps of generating a second data log showing a second area of the lateral well exhibiting high free gas porosity, and using the second data log showing the second area of the lateral well exhibiting high free gas porosity to further adjust the direction of the drill bit drilling the lateral well.

BRIEF DESCRIPTION OF THE DRAWINGS

FIG. 15 is the data log shown in FIG. 14 but with the stage length designed in accordance with the method of the present invention.

DETAILED DESCRIPTION OF THE INVENTION

The inventor's U.S. patent application Ser. No. 12/786, 925, filed May 25, 2010, and incorporated herein by reference, describes a novel optical flow cell assembly. The method described herein uses the data generated by the flow cell assembly during hydrocarbon drilling operations to complete the well for production purposes. By designing the completion program based on such data, the completion operator can achieve improved hydrocarbon production at each stage while reducing operational costs. Improved stage placement, stage length and perforation cluster design are achievable using the method of the present invention. These and other advantages will be described herein.

Figure 1:
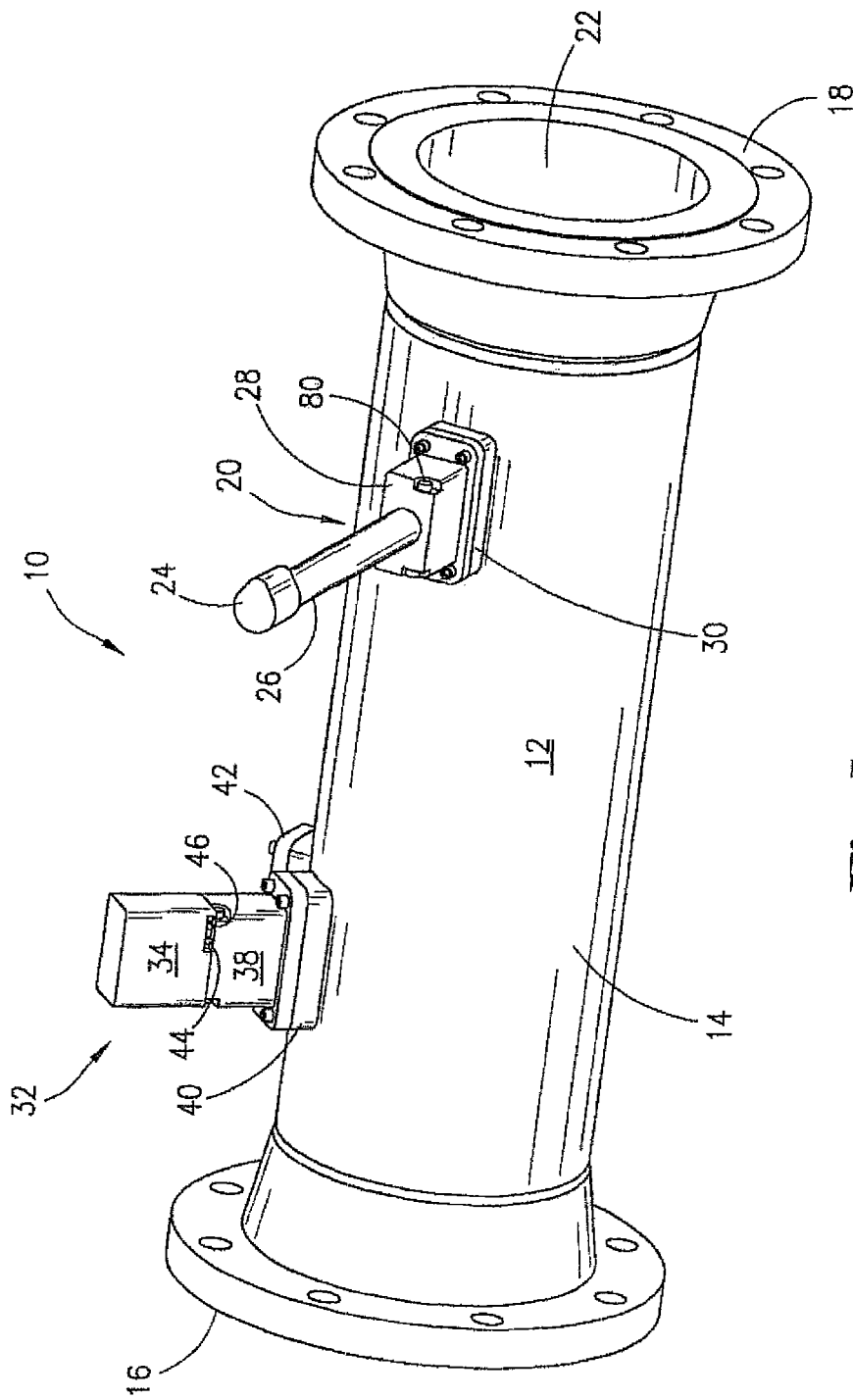
FIG. 1 is a perspective view of the flow cell assembly of the present invention.

With reference to FIG. 1, flow cell assembly 10 includes flow cell 12. Flow cell 12 includes longitudinal portion 14 and flange members 16, 18. Portion 14 has an inner diameter that corresponds with the inner diameter of the flow line to which flow cell 12 is to be attached. It is to be understood that the inner diameter of flow cell 12 may be made in different diameters depending on the inner diameter of the flow line that will receive flow cell 12. Members 16 and 18 are designed to be affixed to respective ends of the flow line preferably by bolted connection with corresponding flanges. When flow cell 12 is connected to the flow line, flow cell 12 is in fluid communication with the flow line.

Again with reference to FIG. 1, flow cell assembly 10 includes optical probe assembly 20. Assembly 20 is detachably affixed to the outer surface of flow cell 12. A bore (not shown) in flow cell 12 permits passage of optical probe 48 (not shown) from outside flow cell 12 to within inner bore 22 of flow cell 12. As shown in FIG. 1, assembly 20 includes probe cap 24, probe sleeve 26, valve orientation holding cell 28, and mounting plate 30. Mounting plate 30 may be mounted onto the outer surface of flow cell 12 by any number of mounting means. For example, mounting plate 30 may be affixed to flow cell 12 by bolts or screws. Valve orientation holding cell 28 is detachably affixed to mounting plate 30 by any suitable mounting means. For example, cell 28 many be detachably affixed to mounting plate 30 by bolts or screws. The distal end of probe sleeve 26 is slidably positioned within valve orientation holding cell 28. Probe cap 24 may be detachably positioned on the proximal end of probe sleeve 26 when assembly 20 is non-operational.

FIG. 1 also shows pressure/temperature assembly 32. Assembly 10 may function without assembly 32. Assembly 32 may be detachably affixed to the outer surface of flow cell 12. A second bore (not shown) in flow cell 12 permits the passage of temperature and pressure sensors into bore 22 of flow cell 12. Assembly 32 includes PT housing cover 34, PT block 36 (although not shown, a temperature/pressure sensor array attaches to PT block 36), second valve orientation holding cell 38 and mounting block 40. PT block 36 includes temperature lead 44 and pressure lead 46. PT block could contain a combined temperature/pressure lead. Mounting plate 40 may be mounted onto the outer surface of flow cell 12 by any number of mounting means. For example, mounting plate 40 may be affixed to flow cell 12 by bolts or screws. Second valve orientation holding cell 38 is detachably affixed to mounting plate 40 by any suitable mounting means. For example, cell 38 may be detachably affixed to mounting plate 40 by bolts or screws. Mounting plates 30 and 40 may be identical components. Cells 28 and 38 may also be identical components.

Mounting plates 30, 40 have radii based on pipe size. Any number of mounting plates 30 and 40 may be detachably secured to flow cell 12. For example, two mounting plates 30 and two mounting plates 40 may be detachably fixed to flow cell 12. One set of mounting plates 30, 40 may be positioned on one side of flow cell 12 and the other set of mounting plates 30, 40 may be positioned on the opposite side of flow cell 12. By including multiple mounting plates 30, 40, probe assembly 20 and pressure/temperature assembly 32 may be secured to respective mounting plates 30, 40 in different spatial positions on flow cell 12. This is desirable because the positioning of flow cell 12 in the flow line could result in an obstruction that would prevent the detachable fixation of assemblies 20, 32 on one of mounting plates 30, 40 but not on the other set of mounting plates 30, 40 which are situated on the opposite side of flow cell 12.

When probe assembly 20 is not detachably affixed to mounting plate 30, blank cover 42 may be detachably affixed to mounting plate 30. Cover 42 may be detachably affixed to mounting plate 30 by any suitable means. For example, cover 42 could be detachably secured to mounting plate by bolts or screws. When probe assembly 32 is not detachably affixed to mounting plate 40, blank cover 42 may be detachably affixed to mounting plate 40. Cover 42 may be detachably affixed to mounting plate 40 by any suitable means. For example, cover 42 could be detachably secured to mounting plate by bolts or screws. When secured to mounting plates 30, 40, cover 42 acts to prevent the passage of fluid such as flare gas from escaping through the bores in flow cell 12 to the atmosphere.

Figure 2:
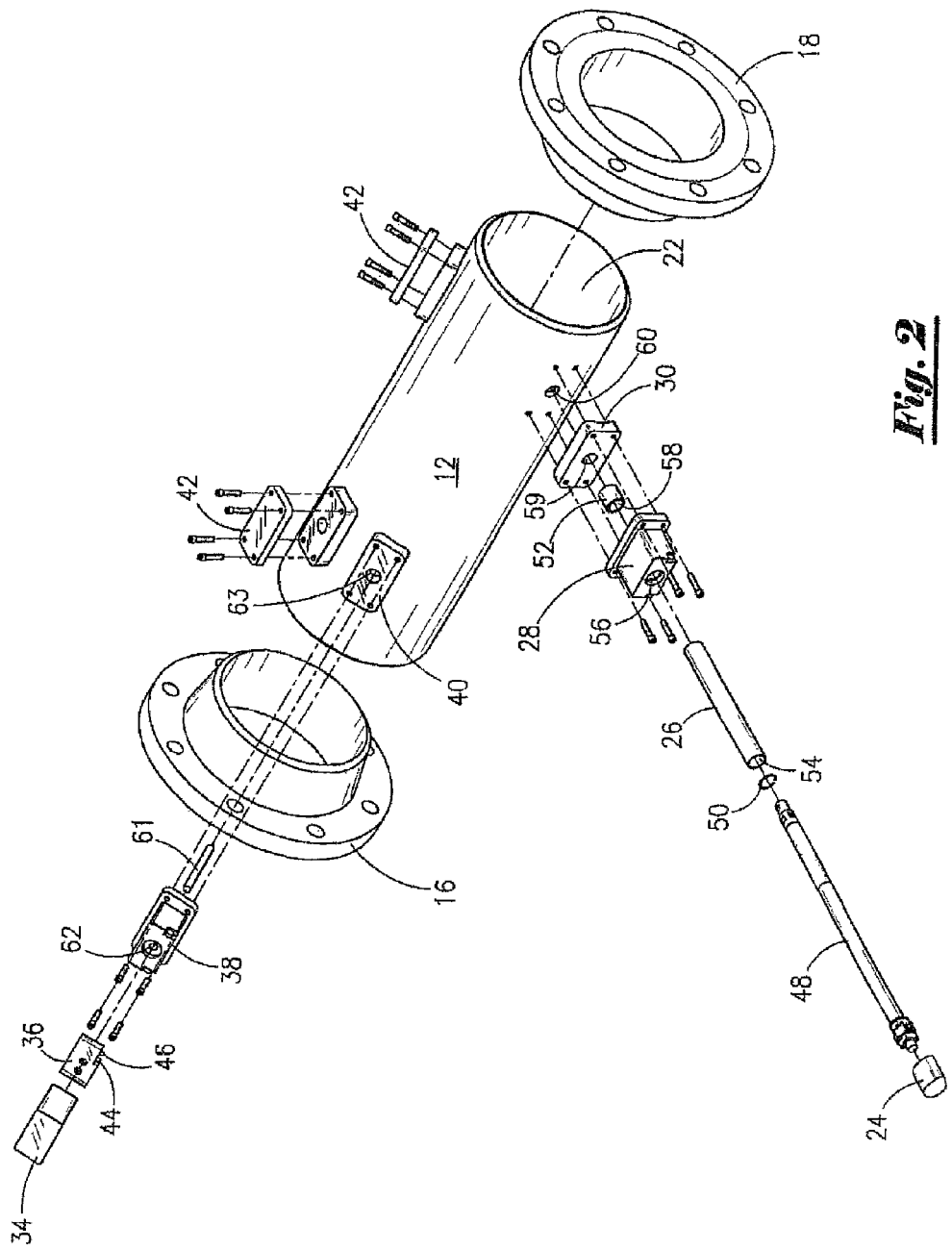
FIG. 2 is an exploded perspective view of the flow cell assembly of the present invention.

With reference to FIG. 2, optical probe assembly 20 further includes optical probe 48, orientation ring 50 and probe socket 52. Probe 48 is designed to be inserted through ring 50, through inner bore 54 of sleeve 26, through inner bore 56 of cell 28, through inner bore 58 of socket 52, through inner bore 59 of mounting plate 30 and through bore 60 in flow cell 12. The distal end of probe 48 sets within inner bore 22 of flow cell 12 at a predetermined position, e.g., ¼" radius. Sensor array 61 is designed to be inserted through inner bore 62 of cell 38, through inner bore 63 of mounting block 40 and through bore (not shown) in flow cell 12. The distal end of sensor array 61 sets within inner bore 22 of flow cell 12 at a predetermined position.

Figure 3:
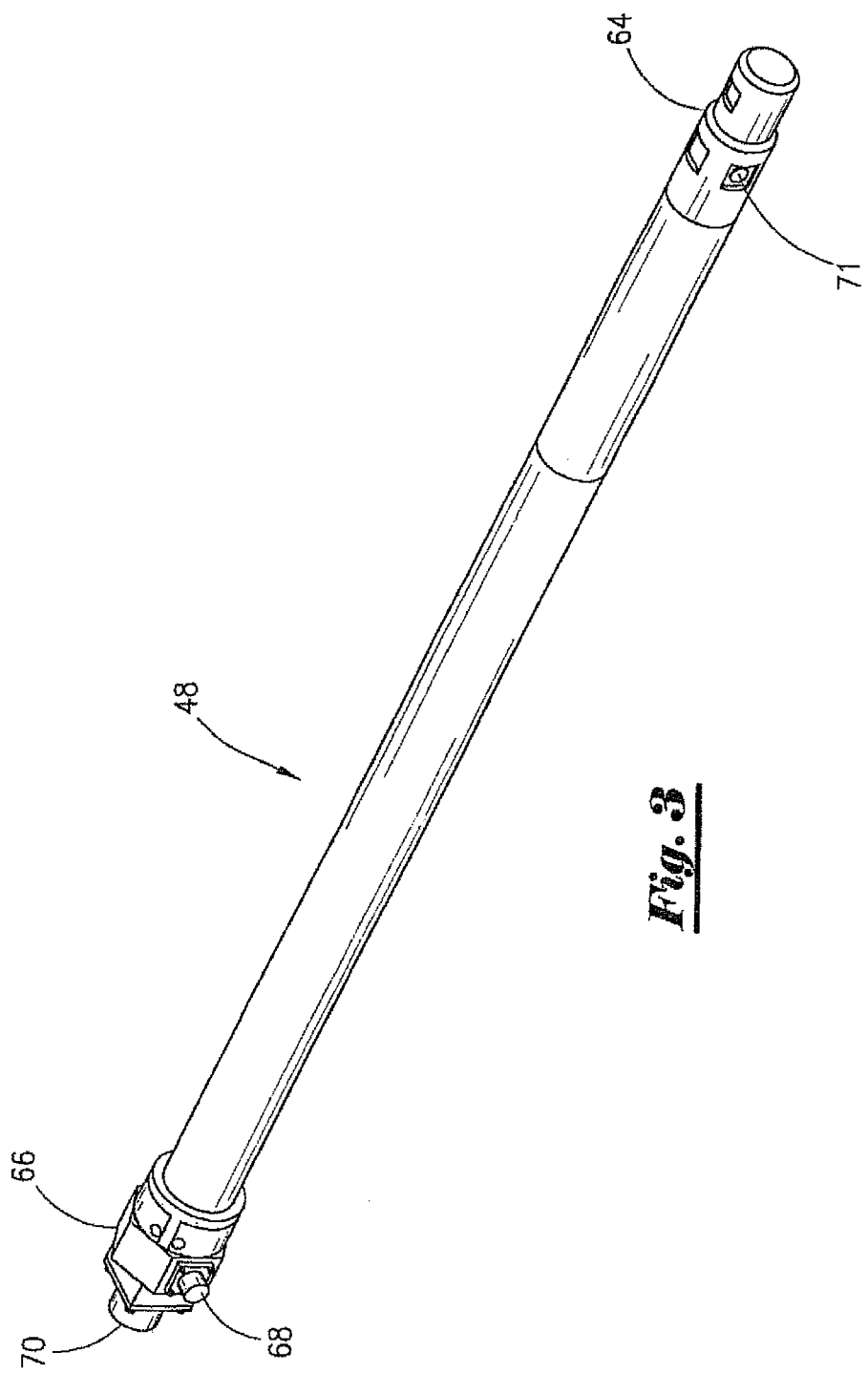
FIG. 3 is a perspective view of the optical probe of the flow cell assembly of the present invention.

FIG. 3 illustrates an embodiment of optical probe 48. Probe 48 contains distal end 64 and proximal end 66. Distal end 64 is designed to be positioned within inner bore 22 of flow cell 12. Proximal end 66 includes heat lead 68 and fiber optic lead 70. Probe 48 may also include opening 71 through which gas may flow for measuring particle velocity. Probe 48 may be any type of optical probe capable of measuring particle velocity. Probe 48 may have the following specifications:

(1) Process temperature −40° C. to +100° C.;
(2) Maximum pressure 150 psig;
(3) Probe dimensions - diameter ¾" and length 27";
(4) Pipe size - 4" to 24";
(5) Measurements range - 0.1 m/s to 150 m/s;
(6) Measurement accuracy -           5% (0.1 m/s-1 m/s)
                                     2.5% (1 m/s-100 m/s)
                                     5% (100 m/s-150 m/s).

Probe 48 may function based on "laser-two-focus" particulate velocimetry. Probe 48 may include laser light sources capable of producing two light beams separated by a fixed distance. Probe 48 may also include a lens system for directing the light beams across opening 71 (shown in FIG. 3). The light may be concentrated in two active sheets of light within opening 71. The active sheets may be perpendicular to the flow direction and separated by a fixed distance. Light is scattered when a particle in the gas flowing through inner bore 22 intersects each active sheet. Probe 48 may further include a second lens system and one or more light detectors. The second lens system may direct the scattered light to one or more of the light detectors. The second lens system may include a mirror for reflecting scattered light in a specified direction. In this way, probe 48 detects particles flowing in the gas. By measuring the time delay between light scattering occurrences in each active sheet, probe 48 may detect the velocity of the gas. Alternatively, probe 48 may function based on "laser-two-beam" particulate velocimetry, in which probe 48 may use light beams to measure the velocity of gas particles by sensing the scintillation of the light beams caused by flow turbulence.

Figure 7:
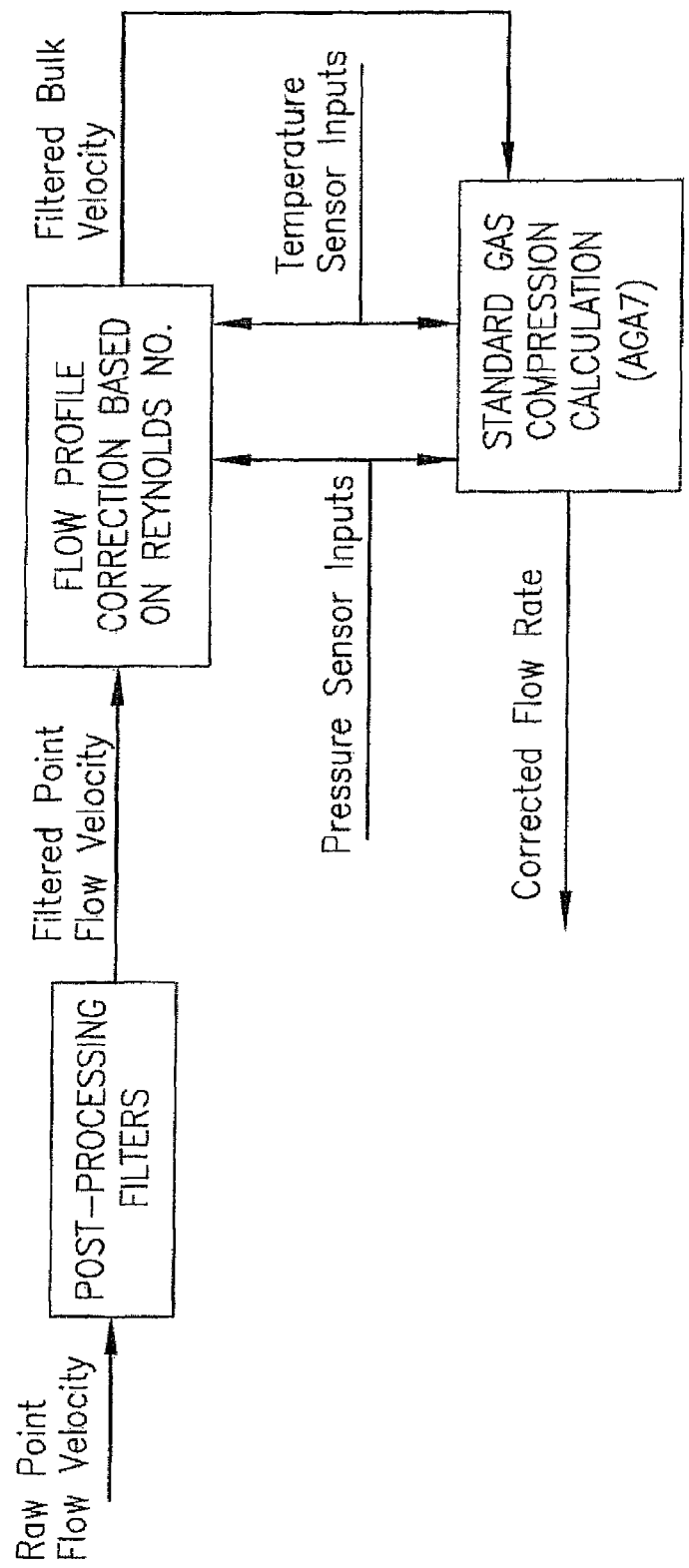
FIG. 7 is a block diagram of the method of calculating a flow rate from raw point velocity values.

Correlation calculation is time based and not affected by optical signal amplitude. No field re-calibration is necessary. Flow rate is calculated in three stages: (1) post processing filters are used to reject errant samples; (2) flow profile correction based on empirical characterizations for each flow meter type and operating condition using Reynolds number correction; and (3) flow rate is calculated for standard conditions using AGA7/AGA8, as illustrated in FIG. 7. Probe 48 is commercially available from Photon Control, Inc. under model name FOCUS Probe Optical gas Flow Meter (L2F) and under the model name Laser-Two-Beam Optical Gas Flow Meter (L2B).

Referring again to FIG. 7, the velocity values detected by probe 48 may be referred to as the raw point flow velocity values in one embodiment. These values may be filtered to reject errant velocity values resulting in filtered point flow velocity data. This filtered raw point flow velocity data may then be corrected for flow profiles based on Reynolds number, or other empirical data of the flow profile. The corrected data may be referred to as the bulk velocity data. From the bulk velocity data, a corrected flow rate for the gas may be calculated based on the internal diameter of longitudinal portion 14, and the temperature and pressure measurements taken by sensor array 61. The temperature and pressure measurements may also be used to calculate the Reynolds number.

The use and operation of an optical probe 48 is described in International Patent Application Publication No. WO 2006/063463 and in Canadian Published Patent Application CA 2 490 532 A1, which are each incorporated herein by reference.

Figure 4:
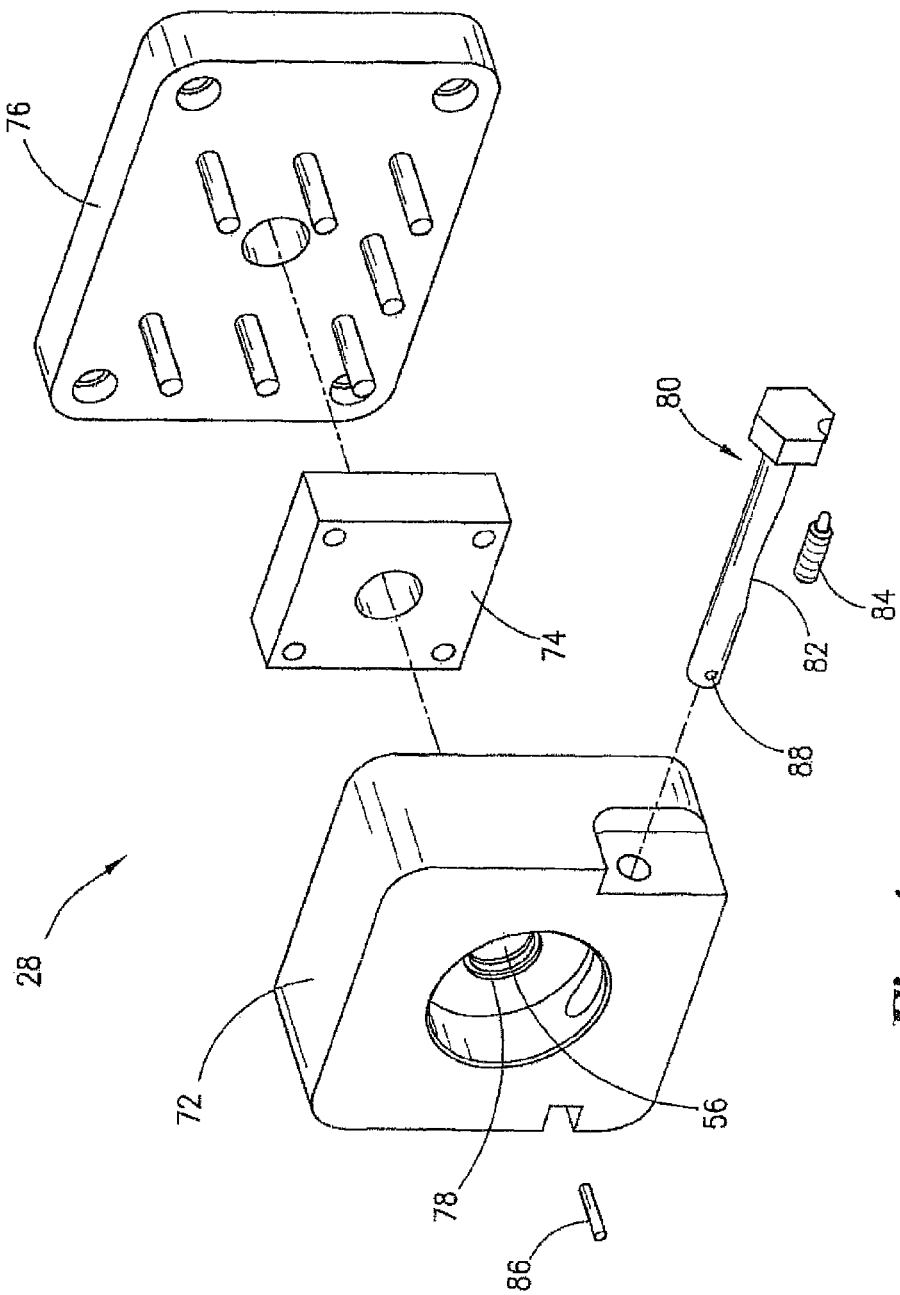
FIG. 4 is an exploded perspective view of the valve orientation holding cell component and locking cam assembly of the present invention.

As seen in FIG. 4, valve orientation holding cell 28 (and cell 38) includes cover 72, internal isolation valve 74, and back plate 76. Cover 72 includes one or more O-rings 78 positioned around bore 56. When probe 48 is inserted in probe assembly 20, probe 48 is run past O-rings 78 to isolation valve 74 (e.g., a ball valve assembly). Valve 74 has previously been actuated and has sealed flow cell 12. O-rings 78 form a seal around probe 48. Valve 74 is deactivated and no longer seals the passage to flow cell 12. Probe 48 may then be inserted further to a predetermined point where a portion of distal end 64 of probe 48 sets within bore 22 of flow cell 12. O-rings 78 provide a seal preventing gas within flow cell 12 from escaping to the atmosphere. When removing probe 48, probe 48 is pulled out of flow cell 12 to a predetermined position where valve 74 can be actuated while O-rings 78 continue to provide a seal around probe 48. After valve 74 is actuated, probe 48 may be removed from probe assembly 20.

As seen in FIG. 4, valve orientation holding cell 28 (and cell 38) includes locking cam 80, which is insertable through a bore in cover 72. Cam 80 contains recess 82. Recess 82 houses spring locking pin 84. Cam pin 86 may be inserted through cam pin hole 88 in locking cam 80. Locking cam 80 locks probe 48 or sensor array of PT Block 36 into a fixed position and orientation. The mechanism consists of a round plug with an orientating groove machined into that fits into a matching socket. When the plug is orientated correctly, a cam shaft is able to rotate into the plug groove providing for fixed position and orientation. This cam shaft is manually rotated by a hex head. This hex head is notched in such a manner that when the cam shaft is fully engaged, the notch becomes engaged with a spring loaded locking pin. The pin locks the cam shaft assembly in the engaged position so that it can not become disengaged unless released by the user pushing the locking pin back into a neutral position thus allowing the hex head to rotate the cam shaft freely back into the unlocked position.

Figure 5:
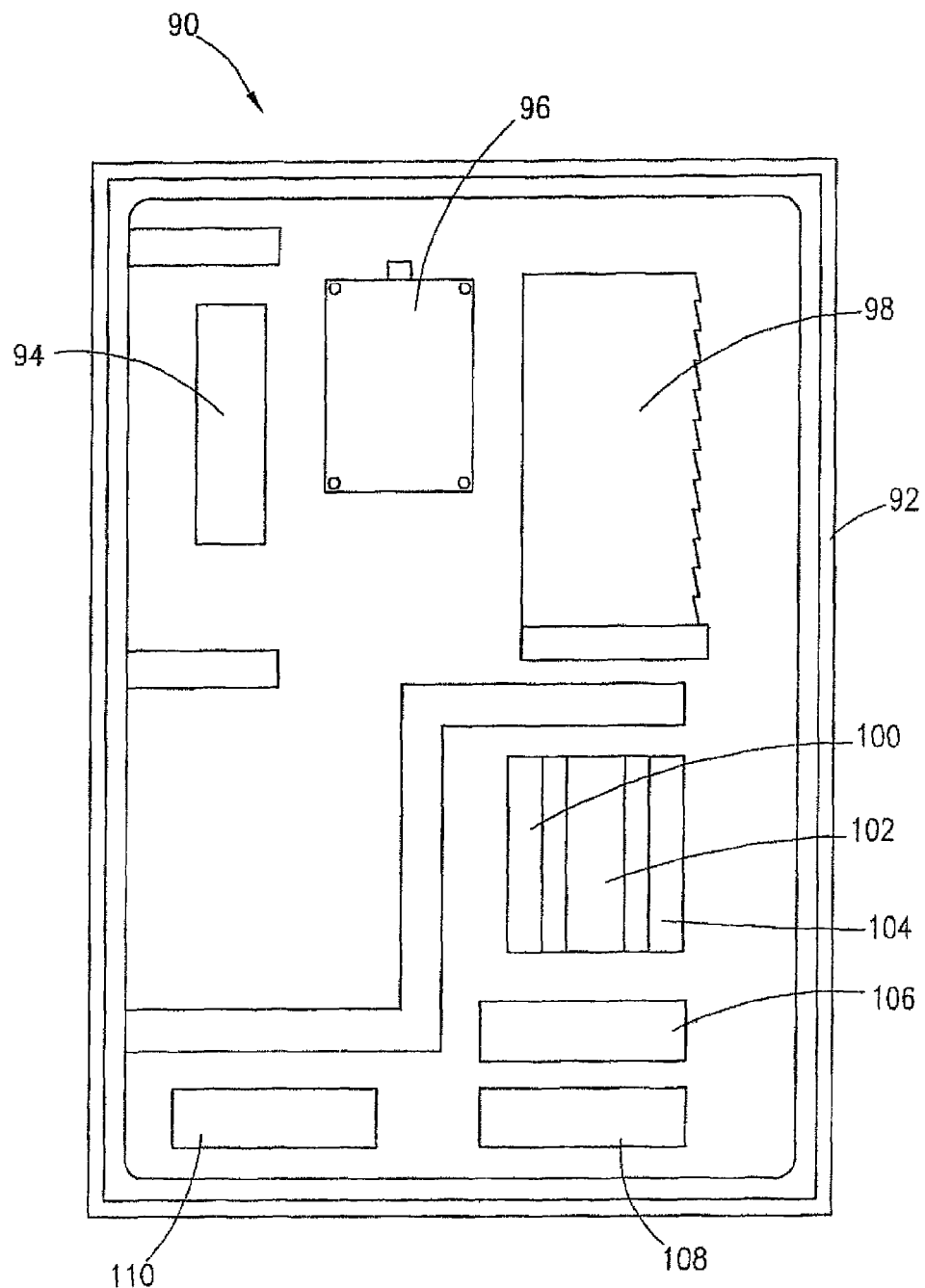
FIG. 5 is a schematic of the components of the control panel assembly of the present invention.

FIG. 5 shows control assembly 90. Assembly 90 includes control panel 92. Panel 92 includes power supply 94, wireless transmitter 96, flow computer 98, heater barrier 100, temperature barrier 102, pressure barrier 104, intrinsically safe power supply 106, intrinsically safe terminals 108, and other terminals, power, 4-20 output and other devices 110.

Figure 6:
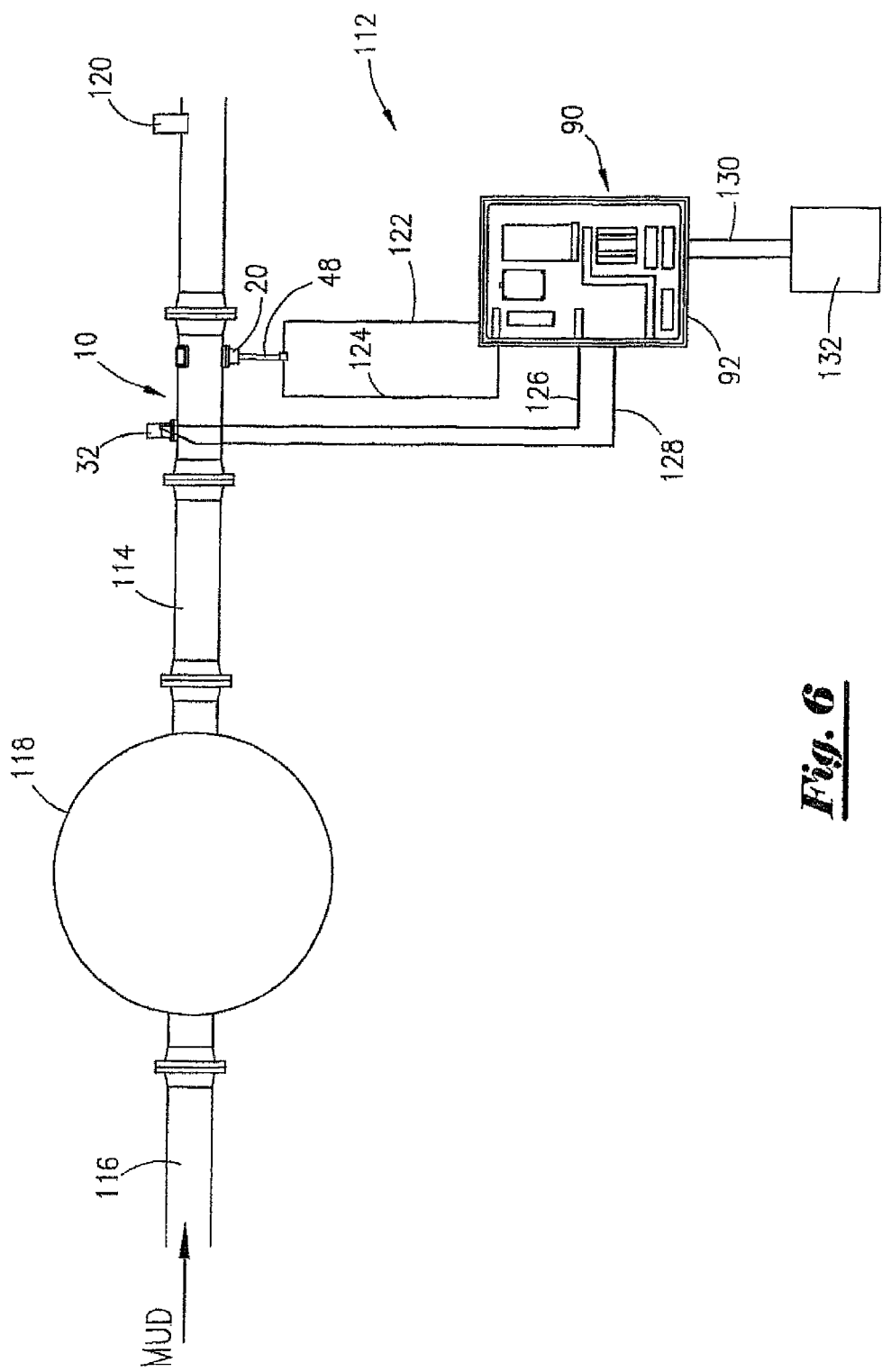
FIG. 6 is a schematic of the flare gas metering system of the present invention.

Computer 98 may be wirelessly accessible so that control over the flow cell assembly may be accomplished remotely. Data generated from measuring the gas passing through flow cell 12 may also be wirelessly transmitted to a remote location or computer for further processing and analysis. Computer 98 may have the following specifications:

(1) RS-485
   (a) Format 8N1
   (b) Modbus RTU
   (c) 2400, 9600, and 38,400
(2) RS-232
   (a) Format 8N1
   (b) Proprietary protocal
   (c) 38,400 only
(3) 4-20 ma analog
(4) Probe alarm As illustrated in FIG. 6, flare gas metering system 112 includes flow cell assembly 10 and control assembly 90.

System 112 is incorporated into flare line 114, which is part of an oil and gas drilling rig flare assembly. Drilling mud return line 116 carries back fluids from the well and deposits them in separator 118. The fluids contain liquids and gases (some of which are flammable). The liquids exit the bottom of the separator and the gases exit the top through flare line 114. Flare line 114 has an ignition source 120 positioned at the end of the line which ignites the flammable gas exiting line 114. Flow cell assembly 10 has been positioned in fluid communication with the gas passing through line 114. Probe assembly 20, and in particular probe 48, is operatively connected to control assembly 90 via optical conduit 122 and heat conduit 124. Pressure/temperature assembly 32, and in particular PT block 36, is operatively connected to control assembly 90 via temperature conduit 126 and pressure conduit 128. Control assembly 90, namely control panel 92, is operatively connected via power line 130 to power source 132. Power source 132 can be any type of power source supplying power (e.g., electrical) to control assembly 90 and flow cell assembly 10. Power source 132 could be an electrical generator.

It is to be understood that flow cell 12 need not be used as part of the system 112. Probe assembly 20 and pressure/temperature assembly 32 (or probe assembly 20 alone) are capable of being directly connected to flare line 114. A magnetic jig may be used to determine the placement of mounting plates 30, 40 on line 114. Using the jig, holes may be drilled for securing mounting plates 30, 40 to line 114. The jig will also position the placement of the bores though line 114 that will accommodate probe 48 and the sensor(s) of PT block 36. Probe assembly 20 and pressure/temperature assembly 32 may be affixed to line 114 as described hereinabove.

Once mounting plates 30, 40 are affixed to flow cell 12 or line 114, the assembly and positioning of probe assembly 20 and pressure/temperature assembly 32 is straightforward and easily undertaken. With the attachment of valve orientation holding cell 28 and fixation of orientation ring 50 and probe sleeve 26, probe 48 is self-aligning. Probe 48 may be inserted into flow cell 12 or line 114, removed, and reinserted without having to readjust or realign any of the components. Moreover, the depth of insertion of probe 48 within flow cell 12 or line 114 is predetermined. The same is true for assembly 32. When cell 38 is fixed to mounting plate 40, PT block 36 with its extended sensor array is self-aligning. The sensor array may be inserted into flow cell 12 or line 114, removed, and reinserted without having to realign or readjust any of the components.

Optical probe 48 collects light intensity data each time a particle scatters the light in each of the two sheets within inner bore 22 (or flare line 114). Optical probe 48 transmits the light intensity data through optical conduit 122 to control panel 92. Pressure/temperature assembly 32 measures the temperature and pressure of the fluid within flare line 114. Pressure/temperature assembly 32 transmits the temperature and pressure measurements through temperature conduit 126 and pressure conduit 128 to control panel 92. Computer 92 calculates the raw velocity of the particles based on the time between light scattering occurrences. Computer 92 filters the raw velocity values and rejects outlier values. Pressure and temperature values and flow profile information are used to calculate the flow rate of the gas in flare line 114. If pressure/temperature assembly 32 is not included, computer 92 may use a predetermined fixed pressure value and temperature value in calculations.

System 112 may be used in well completion operations to increase gas production and reduce operational costs. While not limited to any particular type of well or formation, the present invention has been found useful in the completion of lateral or horizontal wells such as those completed in what is known as the "Haynesville Shale."

The particulars of the Haynesville Shale and conventional methods of completing wells in the formation are described in the following articles that are incorporated herein by reference:

(1) Pope, C. D. et al., "Improving Stimulation Effectiveness—Field Results in the Haynesville Shale," Society of Petroleum Engineers, SPE 134165, 2010;

(2) Thompson, J. W., "An Overview of Horizontal Well Completions in the Haynesville Shale," Society of Petroleum Engineers, CSUG/SPE 136875, 2010;

(3) Pope, Charles et al., "Haynesville Shale—One Operator's Approach to Well Completions in the Evolving Play," SPE 125079, 2009.

The Haynesville Shale formation extends over 5-8 million acres in Northeast Texas and Northwest Louisiana. It is thought to be the largest and most active shale gas play in the U.S. The Haynesville Shale is a sedimentary rock formation of the Late Jurassic age deposited about 150 million years ago. The formation is overlain by the Cotton Valley Group and underlain by the Smackover limestone. The Haynesville Shale is a black, organic rich shale that primarily is made up of clay-sized particles with small amounts of silt and sand. Estimates have reported that 80% of the Haynesville Shale exists as free gas with the remaining 20% absorbed on organic surfaces. It has a true vertical depth (TVD) greater than 11,000 feet, temperatures greater than 300° F., and reservoir pressures up to 0.9 psi/ft.

Production of the Haynesville Shale reservoir has involved horizontal drilling and multistage hydraulic fracturing. Operators strive to contact as much rock as possible with a fracture network of adequate conductivity. This is done by altering completion techniques such as lateral length, number of stages, and perfection cluster spacing. Hydraulic fracturing designs have also been altered such as multiple stages, diversion job size and the like.

Completion design has treated the reservoir as being composed of homogenous rock. For example, during well completion, a lateral well is drilled through the formation. The lateral can be anywhere from 3,000 feet to greater than 5,000 feet. The operator equally spaces the stages along the lateral. Each stage may be about 300 feet. The operator puts two perforation or perf clusters per stage, which are spaced about 85 feet from each other. This completion design will exhibit variable performance among the stages, and even within each stage. Varying production is attributable to the heterogeneous nature of the shale in which some formation rock shows increased production and some formation rock shows less production.

It is advantageous to group "like" rock to increase performance. The grouping of like rock may be done by gamma ray and mud logs together with the examination of drill cuttings. More intricate methods of grouping like rock may involve evaluating the following log measurements:

(1) image log;
(2) spectroscopy-based lithology log;
(3) sonic log; and
(4) pulse neutron log.

The equipment used to acquire image log, spectroscopy-based lithology log, sonic log, and pulse neutron log data can be cost prohibitive. The inventor has discovered that data generated from flow cell assembly 10 can be effectively used to design well completions in such a way as to increase production and lower operational costs. The expense associated with use of the flow cell assembly 10 is considerably more cost-efficient then the more intricate image log, spectroscopy-based lithology log, sonic log, and pulse neutron log systems. The flow cell assembly 10 may be used to:

(1) identify areas of high free gas porosity;
(2) group "like" rock;
(3) determine stage length and variation in stage length along the lateral; and
(4) determine perf cluster spacing and location.

The Haynesville Shale is heterogeneous having discrete areas of ductile and brittle shales. The brittle shales typically have a high calcite content. The flow cell assembly 10 shows these areas of brittle shales to exhibit high free gas porosity. It is believed that the brittle shales contain natural fractures. When brittle shales are subject to fracturing processes during well completion, the fractures have a tendency to stay open as a result of proppant migration into the fractures. In contrast, when ductile shale is fractured, the shale is more susceptible to closing back over the proppant leading to less production in that area. By using the flow cell assembly 10, areas exhibiting increased gas production, such as those composed of brittle shale, can be identified. The operator can then design the stages within the lateral well with such high gas areas in mind. For example, the operator can employ a shorter stage length with smaller spacing between perf clusters within the favorable area. The operator can also employ a longer stage length with increased spacing between perf clusters in those areas exhibiting low gas production.

The flow cell assembly 10 can also be used to assist in the directional drilling of the horizontal lateral wells. For example, if the formation includes a layer of brittle shale, it is desirable to drill the lateral well immediately under the layer so that when the well is fractured, the fractures will extend upward, into the layer exhibiting greater gas production. If the well bore is drilled to a position below the layer such that when the well is fractured, the fractures fail to penetrate into the layer of brittle shale, the fractures are more likely to close back up due to proppant embedment. The resultant production in this area is therefore diminished. Accordingly, the closer the lateral well, or a particular stage of the lateral well, is to the bottom of the brittle shale layer, the more likely that gas production will be optimized.

By evaluating the data generated by the flow cell assembly 10, the driller can use the data to determine where to steer the bottom-hole assembly to position the well. The data from the flow cell assembly 10 indicates when the drilled well comes close to or "bumps" the bottom of the brittle layer. When the well closes on or bumps the bottom of the brittle layer, the flow cell assembly 10 will register a small amount of high free gas porosity.

The production results achieved as a result of the use of the flow cell assembly 10 to design the completion program or drill the lateral well can be verified by a production log such as a production temperature log.

Figure 8:
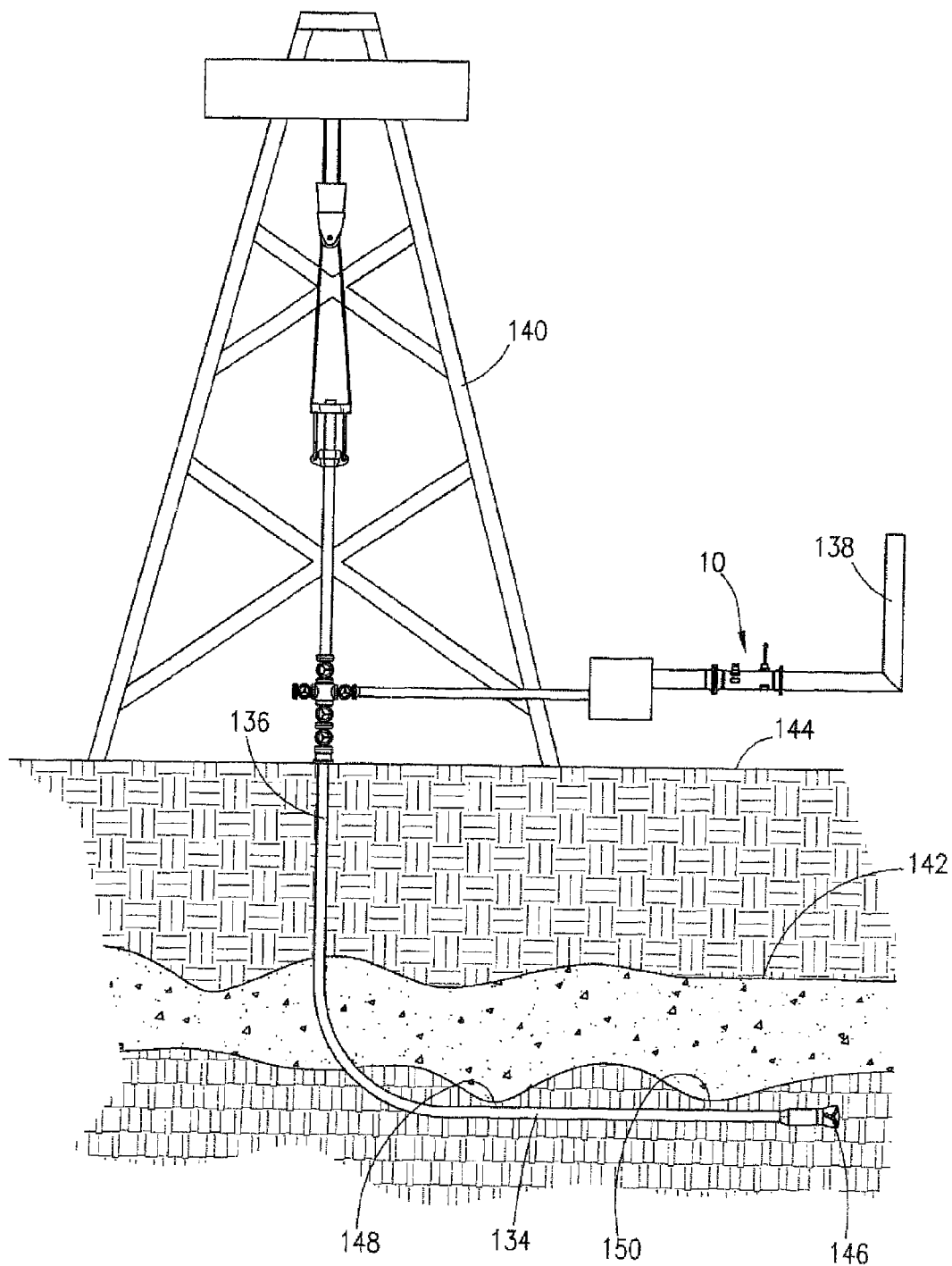
FIG. 8 is a schematic showing the drilling of a lateral well underneath a shale formation.

FIG. 8 depicts the drilling of lateral well 134 off of main vertical well bore 136. Flow cell assembly 10 is shown in fluid communication with flare line 138 which is operationally associated with drilling rig 140 as would be well known to a skilled artisan. Target formation 142, e.g., shale formation, is shown below well surface 144. The lateral well contains drill bit 146. During drilling of lateral well 134, free gas flows back to well surface 144 via lateral well 134, well 136 and through flare line 138. Flow cell assembly detects the flow rate of the free gas returned to well surface 144. Based on this data, flow cell assembly 10 generates a data log exhibiting the areas of high free gas porosity along the length of lateral well 134. Areas exhibiting high amounts of free gas porosity would be those brittle areas, such as dip areas 148 and 150, in closer proximity to lateral well 134.

Figure 9:
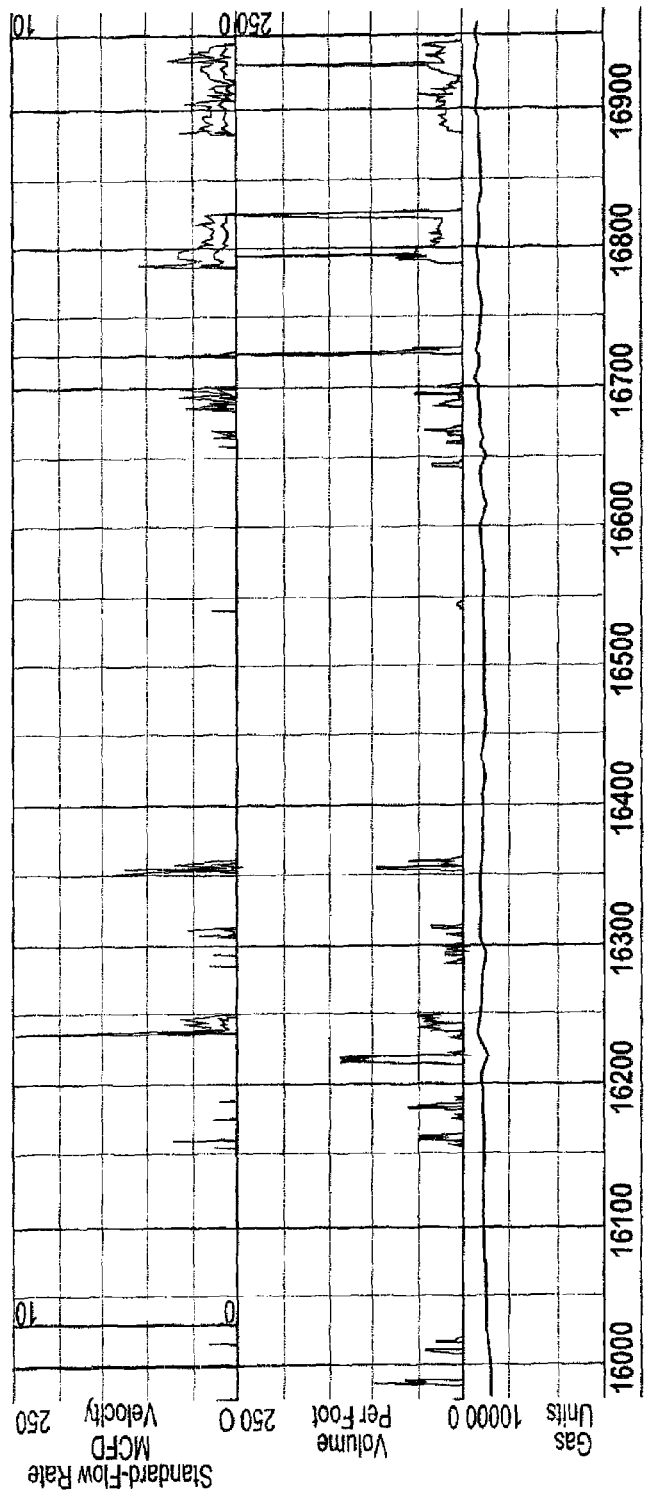
FIG. 9 is a data log generated by the flow cell assembly of the present invention showing areas of high free gas porosity.

FIG. 9 shows a data log generated by flow cell assembly 10 during the drilling of lateral well 134. The section of the lateral represented in the log extends from 16000 feet to 17000 feet. The graphical data represents standard-flow rate MCFD velocity, volume per foot, and gas units. The log shows discrete areas within this section of lateral well 134 exhibiting high free gas porosity indicative of a zone of favorable gas production.

Figure 10:
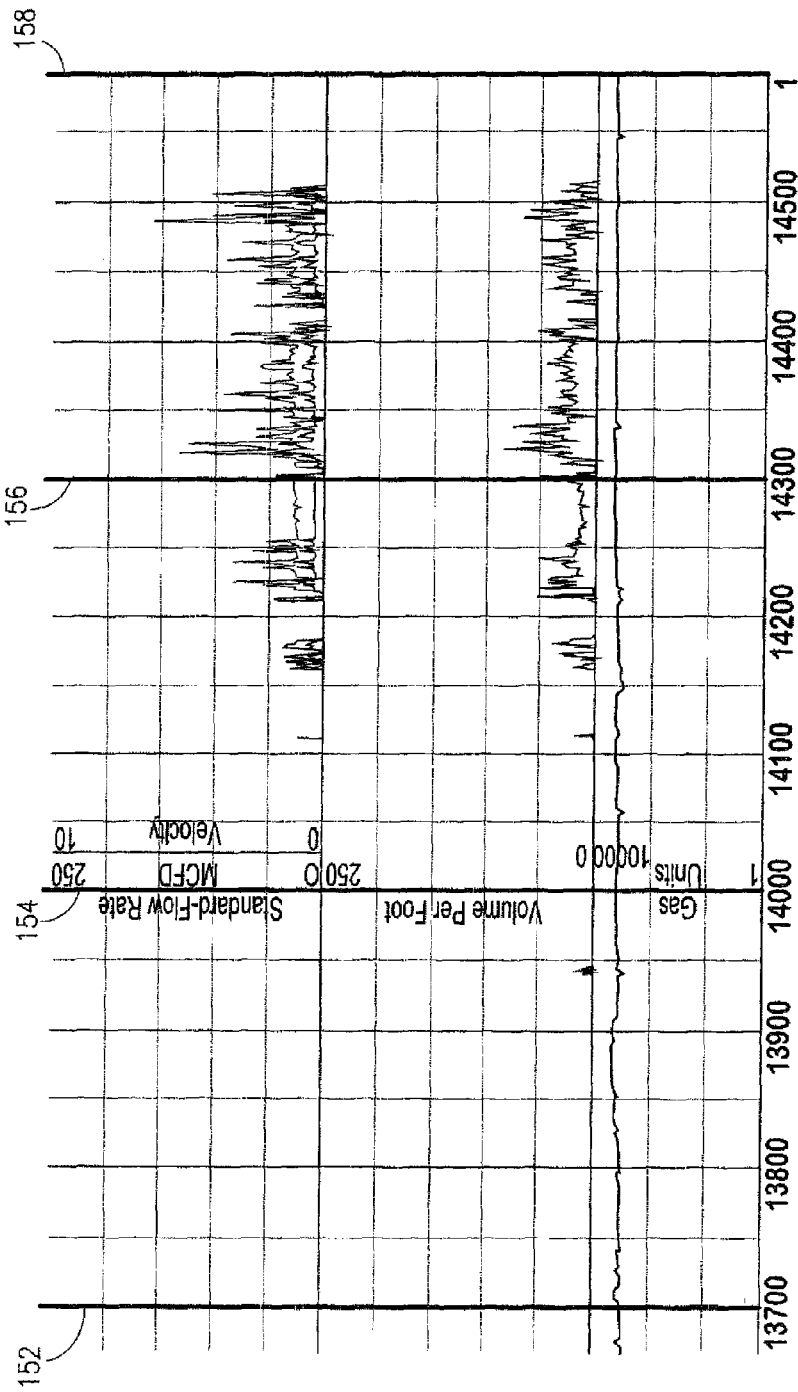
FIG. 10 is a data log generated by the flow cell assembly showing the conventional placement design of stage spacing.

FIG. 10 shows a data log generated by flow cell assembly 10 during drilling of lateral well 134 at a section extending from about 13700 feet to about 14600 feet. Lines 152, 154, 156, 158 depict conventional stage spacing design. Stages 152-158 are equally spaced about 300 feet apart.

Figure 11:
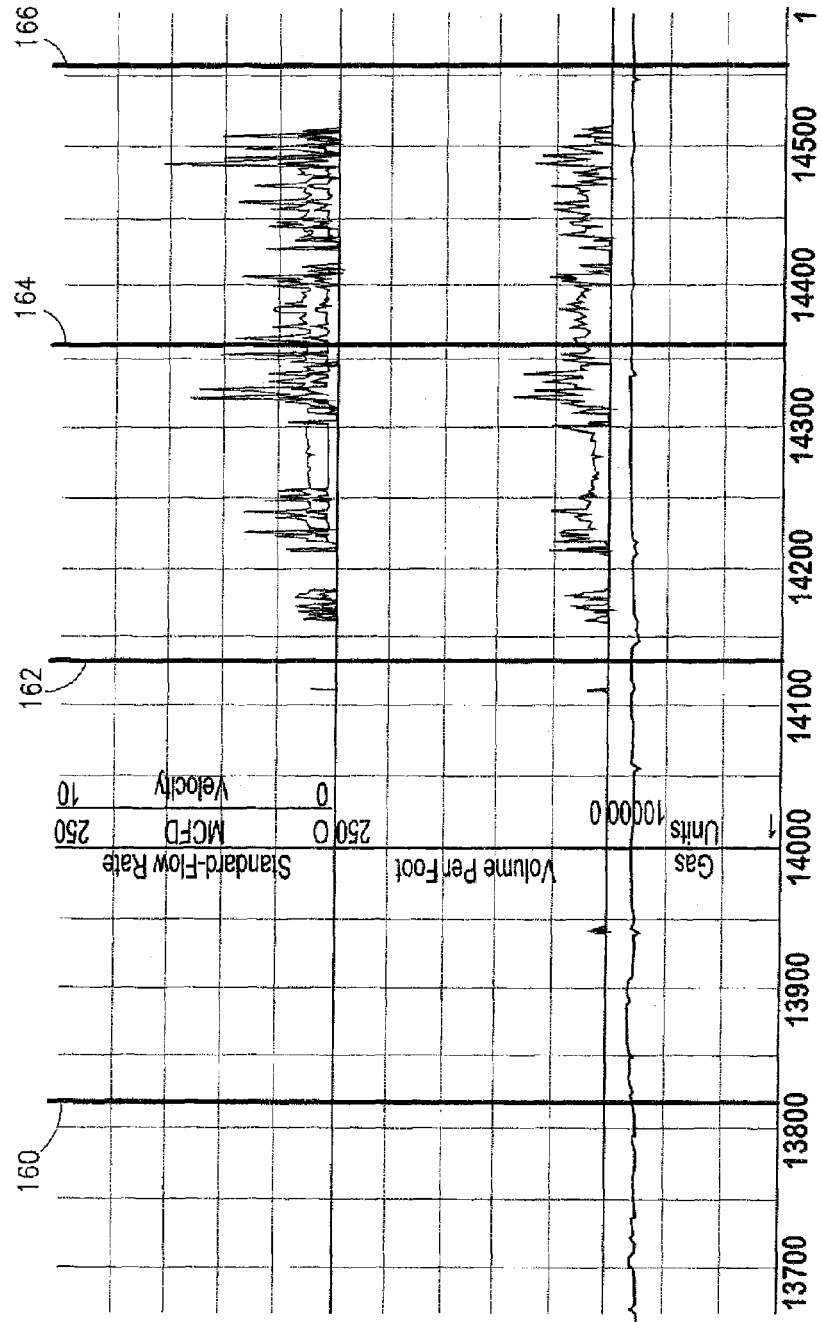
FIG. 11 is the data log shown in FIG. 10 but with stage spacing designed in accordance with the method of the present invention.

FIG. 11 shows the same data log as depicted in FIG. 10 but lines 160, 162, 164, 166 have been designed based on the analysis of the data. Accordingly, the stage between lines 160 and 162 is in excess of 300 feet because this area of lateral well 134 does not show high free gas porosity. The stage between lines 162 and 164 is slightly less than 300 feet because this area shows higher free gas porosity. The stage between lines 164 and 166 is about 200 feet because this area shows the highest concentration of free gas porosity.

Figure 12:
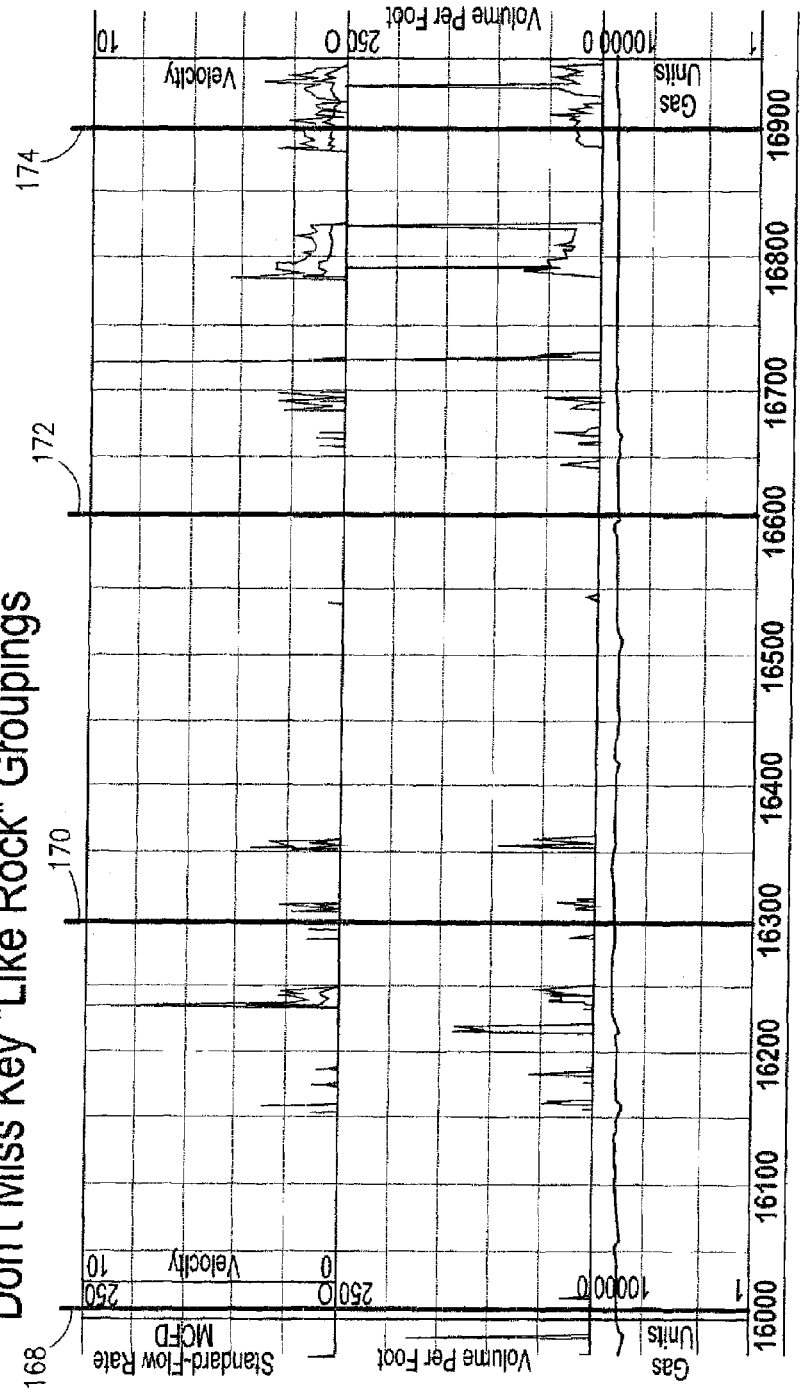
FIG. 12 is a data log generated by the flow cell assembly showing the conventional grouping of "like" rock.

FIG. 12 shows a data log generated by flow cell assembly 10 during drilling of lateral well 134 at a section extending from about 16000 feet to about 16950 feet. Lines 168, 170, 172, 174 depict conventional "like" rock groupings where the stages are spaced equidistant from each other at 300 feet without regard to "like" rock.

Figure 13:
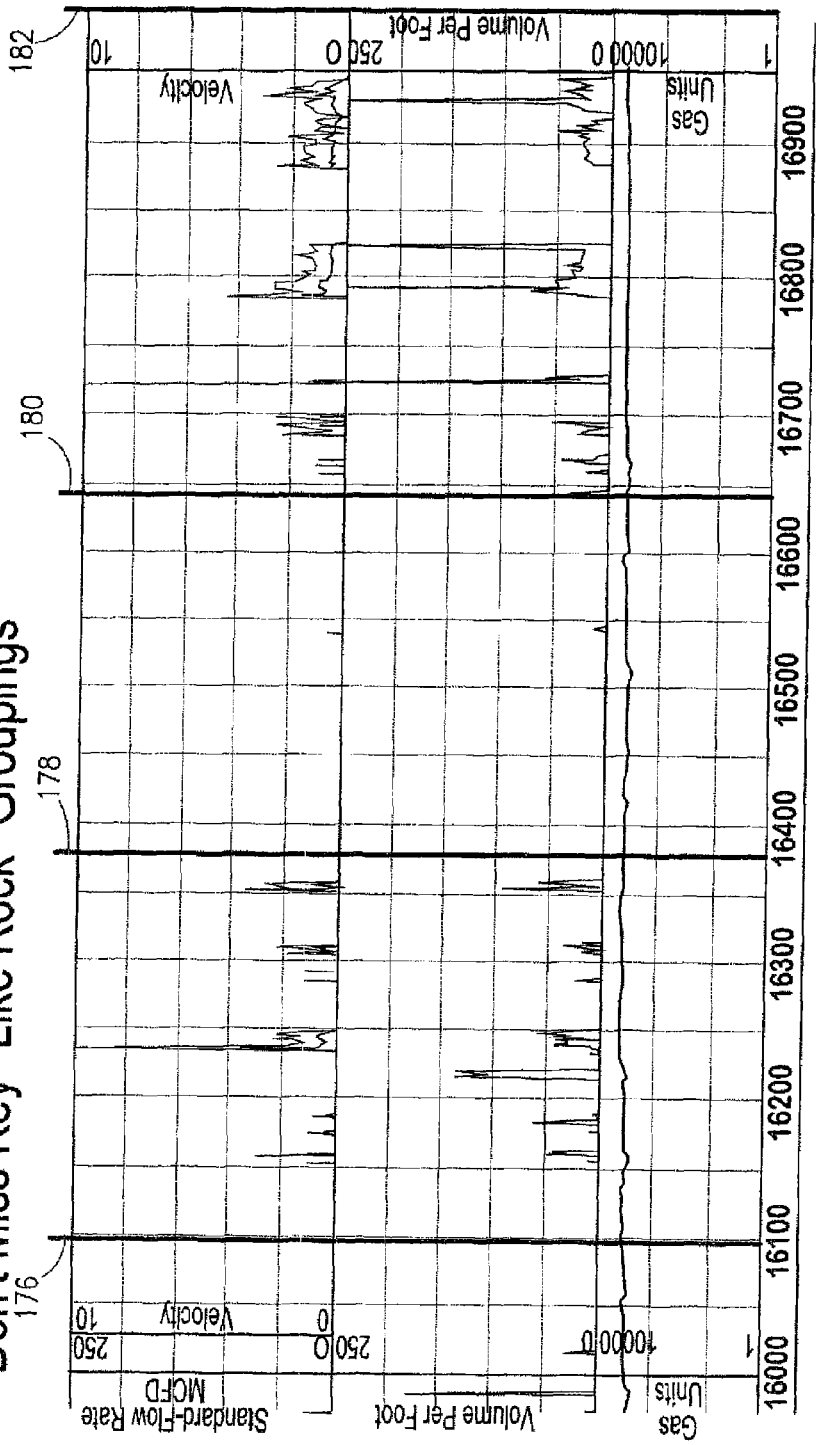
FIG. 13 is the data log shown in FIG. 12 but with the "like" rock grouped in accordance with the method of the present invention.

FIG. 13 shows the same data log as depicted in FIG. 12 but with lines 176, 178, 180, 182 designed based on an analysis of the data to show areas of "like" rock. Accordingly, line 176 has been positioned at about 16100 feet and line 178 has been positioned at about 16375 feet to make the stage inclusive of the "like" rock indicators shown in the log in this section of lateral well 134. Similarly, line 180 has been positioned at about 16645 feet and line 182 at about 16950 feet to make the stage inclusive of the "like" rock indicators shown in the log in this section of lateral well 134.

Figure 14:
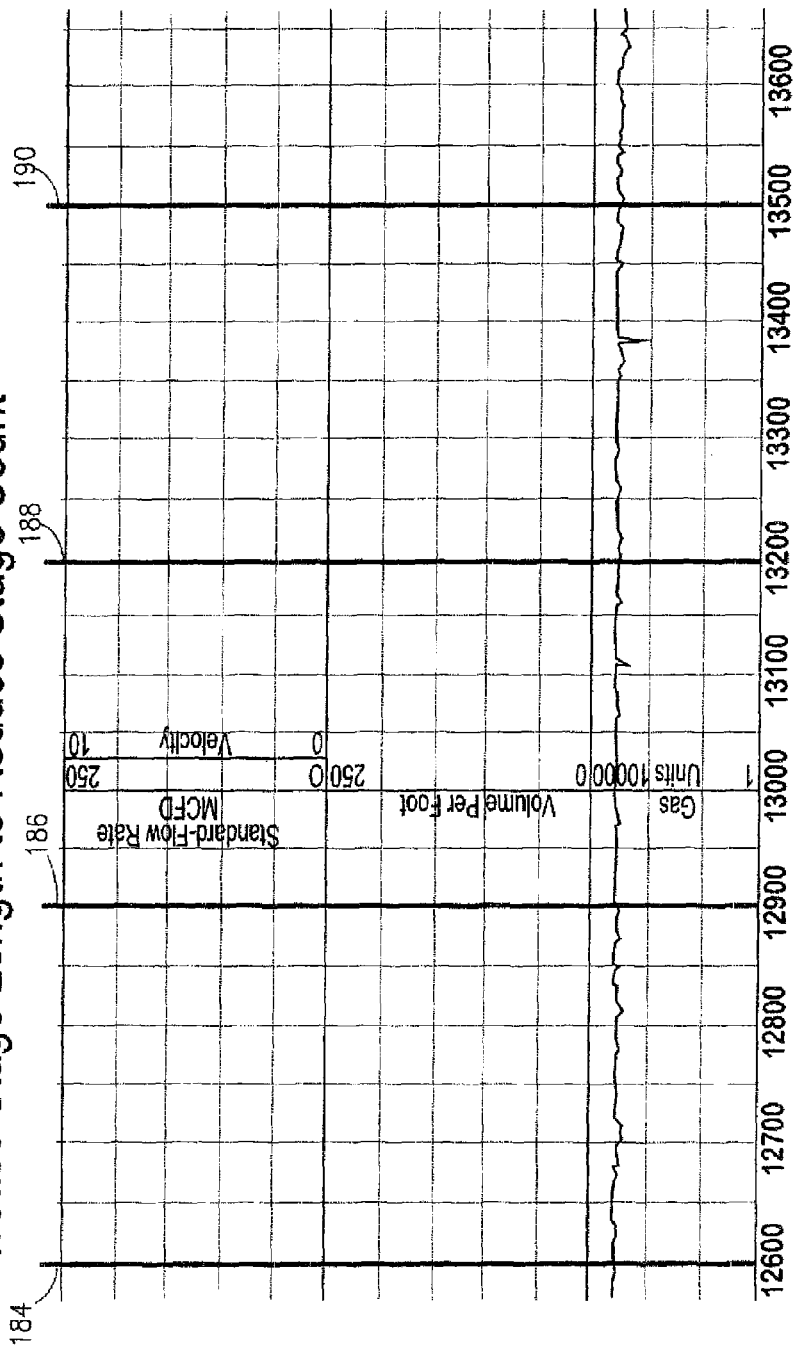
FIG. 14 is a data log generated by the flow cell assembly showing the conventional design of stage length.

FIG. 14 shows a data log generated from flow cell assembly 10 during the drilling of lateral well 134 at a section extending from about 12600 feet to about 13650 feet. Lines 184, 186, 188, 190 depict convention stage placement and length every 300 feet.

FIG. 15 shows the data log depicted in FIG. 15 but with lines 192, 194, 196 designed based on an analysis of the data, which shows a decreased or minimal area of free gas porosity. Accordingly, stage length in this low producing area of lateral well 134 is increased to about 400 feet.

Use and analysis of the data log generated by flow cell assembly 10 during well completion operations can achieve the elimination of one or more stages. Each stage typically costs the operator between $250,000 to $300,00. By eliminating stages, the operator can reduce substantial completion costs while maintaining or increasing gas production. The elimination of stages also results in environmental benefits because less fracturing fluids are used. Accordingly, there is less disposal. Use and analysis of the data log will also maximize production by identifying areas or zones of high free gas porosity so that stages can be concentrated in such areas and within stages, perf clusters located and spaced so as to derive maximum gas capture. Stage length can be increased on those areas identified by low free gas porosity.

While preferred embodiments of the present invention have been described, it is to be understood that the embodiments are illustrative only and that the scope of the invention is to be defined solely by the appended claims when accorded a full range of equivalents, many variations and modifications naturally occurring to those skilled in the art from a review hereof.

What is claimed is:

1. A method comprising:
detecting a velocity of a gas using an optical flow cell assembly within a gas flow line of a rig drilling a lateral well, the gas flow line being in fluid communication with a return flow line of the lateral well, and
generating a data log from the detected velocity, the data log showing areas of the lateral well exhibiting high free gas porosity.

2. The method of claim 1, wherein the optical flow cell assembly comprises:
an optical probe disposed within an internal bore of the optical flow cell, the optical probe detecting raw point flow velocity data of gas in the gas flow line.

3. The method of claim 2 further comprising:
filtering the raw point flow velocity data to reject errant velocity data to obtain filtered raw point flow velocity data;
correcting the filtered raw point flow velocity data to obtain a bulk velocity data; and
calculating a corrected flow rate for the gas in the gas flow line based on the bulk velocity data and an internal diameter of the gas flow line.

4. The method of claim 3 further comprising:
utilizing the corrected flow rate to determine an amount of gas in the return flow line.

5. The method of claim 3, wherein the optical flow cell assembly further comprises:
a sensor array to receive temperature and pressure measurements, the corrected flow rate based on at least one of the temperature and pressure measurements.

6. The method of claim 3, wherein the optical flow cell assembly is communicatively coupled to a computer for filtering the raw point flow velocity data, correcting the filtered raw point flow velocity data, and calculating a corrected flow rate.

7. The method of claim 1, further comprising:
grouping, based on the data log, the areas of the lateral well according to like rock characteristics.

8. The method of claim 1, further comprising:
designing, based on the data log, a plurality of well completion stages.

9. The method of claim 8, further comprising:
determining, based on the data log, at least one of a length of the plurality of well completion stages and a variation in length of the plurality of well completion stages.

10. The method of claim 8, further comprising:
concentrating, based on the data log, the plurality of well completion stages in the areas of the lateral well exhibiting high free gas porosity.

11. The method of claim 8, further comprising:
determining, based on the data log, spacing of a plurality of perforation clusters in each stage of the plurality of well completion stages.

12. A method comprising:
detecting a velocity of a gas using an optical flow cell assembly within a gas flow line of a rig drilling a lateral well, the gas flow line being in fluid communication with a return flow line of the lateral well,
generating a data log from the detected velocity, the data log showing areas of the lateral well exhibiting high free gas porosity, and
adjusting, based on the data log, a direction of a drill bit assembly drilling the lateral wall.

13. The method of claim 12, wherein the optical flow cell assembly comprises:
an optical probe disposed within an internal bore of the optical flow cell, the optical probe detecting raw point flow velocity data of gas in the gas flow line.

14. The method of claim 13 further comprising:
filtering the raw point flow velocity data to reject errant velocity data to obtain filtered raw point flow velocity data;
correcting the filtered raw point flow velocity data to obtain a bulk velocity data; and
calculating a corrected flow rate for the gas in the gas flow line based on the bulk velocity data and an internal diameter of the gas flow line.

15. The method of claim 14 further comprising:
utilizing the corrected flow rate to determine an amount of gas in the return flow line.

16. The method of claim 14, wherein the optical flow cell assembly further comprises:
a sensor array to receive temperature and pressure measurements, the corrected flow rate based on at least one of the temperature and pressure measurements.

17. The method of claim 14, wherein the optical flow cell assembly is communicatively coupled to a computer for filtering the raw point flow velocity data, correcting the filtered raw point flow velocity data, and calculating a corrected flow rate.

18. The method of claim 12, further comprising:
grouping, based on the data log, the areas of the lateral well according to like rock characteristics.

19. The method of claim 12, further comprising:
designing, based on the data log, a plurality of well completion stages.

20. The method of claim 19, further comprising:
determining, based on the data log, at least one of a length of the plurality of well completion stages and a variation in length of the plurality of well completion stages.

21. The method of claim 19, further comprising:
concentrating, based on the data log, the plurality of well completion stages in the areas of the lateral well exhibiting high free gas porosity.

22. The method of claim 19, further comprising:
determining, based on the data log, spacing of a plurality of perforation clusters in each stage of the plurality of well completion stages.

* * * * *